United States Patent
Tsuei et al.

[11] Patent Number: 5,945,722
[45] Date of Patent: Aug. 31, 1999

[54] COLOR ACTIVE PIXEL SENSOR CELL WITH OXIDE COLOR FILTER

[75] Inventors: Gu-Fung David Tsuei, Sunnyvale; Min-Hwa Chi, Palo Alto, both of Calif.

[73] Assignee: National Semiconductor Corporation, Santa Clara, Calif.

[21] Appl. No.: 08/850,576

[22] Filed: May 2, 1997

[51] Int. Cl.$^6$ .................... G02F 1/1343; G02F 1/1335
[52] U.S. Cl. ................ 257/440; 257/232; 257/233; 257/234; 257/257; 257/258; 257/432; 257/437; 257/789; 349/67; 349/97; 349/104; 349/105; 349/106; 349/113
[58] Field of Search ................ 257/232, 233–234, 257/400, 432, 440, 437, 788, 789; 250/553, 208.1, 226; 349/67, 97, 104–109, 113

[56] References Cited

U.S. PATENT DOCUMENTS

| | | | |
|---|---|---|---|
| 4,600,833 | 7/1986 | Shibata et al. | 250/216 |
| 4,910,570 | 3/1990 | Popovic | 257/294 |
| 5,479,049 | 12/1995 | Aoki et al. | 257/232 |
| 5,548,424 | 8/1996 | Takao et al. | 349/104 |
| 5,587,818 | 12/1996 | Lee | 349/106 |
| 5,673,127 | 9/1997 | Takahara et al. | 349/104 |

*Primary Examiner*—Fetsum Abraham
*Attorney, Agent, or Firm*—Limbach & Limbach L.L.P.

[57] ABSTRACT

A color active pixel sensor cell is formed by utilizing four photodiodes which are each covered with a layer of oxide. The thicknesses of the layers of oxide are set so that a first layer of oxide prohibits red light from entering the first photodiode, a second layer of oxide prohibits green light from entering the second photodiode, a third layer of oxide prohibits blue light from entering the third photodiode, and a fourth layer of oxide allows visible light to enter the fourth photodiode. The amount of red light received by the cell is then determined by subtracting the light energy collected by the first photodiode from the light energy collected by the fourth photodiode. Similarly, the amount of green and blue light received by the cell is determined by subtracting the light energy collected by the second and third photodiodes, respectively, from the amount of light energy collected by the fourth photodiode.

14 Claims, 3 Drawing Sheets

COLOR ACTIVE PIXEL SENSOR CELL WITH OXIDE COLOR FILTER

BACKGROUND OF THE INVENTION

1. Field of the Invention

The present invention relates to active pixel sensor cells and, more particularly, to a color active pixel sensor cell with an oxide filter.

2. Description of the Related Art

Conventional imaging circuits rely on photo-diodes to convert a pixel of light energy into an electrical charge that represents the intensity of the light energy. In general, the light energy varies the electrical charge in a manner which is proportional to the photon absorption rate.

FIG. 1 shows a cross-sectional diagram that illustrates a conventional photodiode 10. As shown in FIG. 1, photodiode 10 includes an n+ region 14 which is formed in a p-type substrate 12, and isolated by adjoining regions of field oxide FOX. In addition, a microlens 16 is typically formed over the surface of n+ region 14 to direct more photons to photodiode 10.

In operation, n+ region 14 is initially reverse-biased with respect to p-type substrate 12 by applying a positive voltage to n+ region 14 while grounding p-type substrate 12. Following this, n+ region 14 is floated by removing the positive voltage from n+ region 14.

Next, light energy, in the form of photons, strikes photodiode 10, thereby creating a number of electron-hole pairs in p-type substrate 12 and n+ region 14. The electrons formed in p-type substrate 12 which diffuse to the p-n junction are swept to n+ region 14 under the influence of the junction electric field, while the holes formed in substrate 12 are attracted to ground. Similarly, the holes formed in n+ region 14 which diffuse to the p-n junction are swept to p-type substrate 12, while the electrons formed in n+ region 14 remain in region 14.

Thus, with the addition of each photogenerated electron in n+ region 14, the voltage on n+ region 14 is correspondingly reduced. As a result, photodiode 10 varies the voltage on n+ region 14 in a manner which is proportional to the photon absorption rate.

In a black-and-white imaging system, each pixel is defined by the light energy that is collected by a single photodiode 10. On the other hand, each pixel in a color imaging system is defined by the light energy that is collected by three photodiodes 10 where one photodiode 10 only collects red light, one photodiode 10 only collects green light, and one photodiode 10 only collects blue light.

FIG. 2 shows a cross-sectional diagram that illustrates a portion of a conventional color active pixel sensor cell 20. As shown in FIG. 2, cell 20 includes three photodiodes 10-1, 10-2, and 10-3 which are structurally similar to photodiode 10 of FIG. 1 and, as a result, utilizes the same reference numerals to designate the common structures.

In addition, cell 20 also includes a layer of first polyimide resin 22 which is formed over photodiode 10-1, a layer of second polyimide resin 24 which is formed over photodiode 10-2, and a layer of third polyimide resin 26 which is formed over photodiode 10-3.

Each of the polyimide layers 22, 24, and 26, which function as color filters, are dyed so that, for example, first resin layer 22 only passes red light, second resin layer 24 only passes green light, and third resin layer 26 only passes blue light. As a result, photodiode 10-1 collects only red photons, photodiode 10-2 collects only green photons, and photodiode 10-3 collects only blue photons.

One problem with cell 20, however, is that the layers of polyimide resin 22, 24, and 26 attenuate between 10% and 50% of the photons which are to be passed by the filters, depending on the wavelength of the light. Thus, there is a need for a color active pixel sensor cell that reduces the number of to-be-passed photons that are attenuated by the filter.

SUMMARY OF THE INVENTION

Conventionally, a large percentage of the light which is to be passed by the color filters of a color active pixel sensor cell is attenuated by the layers of dyed polyimide resin that are used as the color filters. The present invention substantially reduces the amount of to-be-passed light that is attenuated by the filters by utilizing four photodiodes which are each covered with layers of oxide that have varying thicknesses.

In the present invention, an active pixel sensor cell, which is formed on a silicon substrate of a first conductivity type, includes a plurality of spaced-apart regions of a second conductivity type which are formed in the substrate. The plurality of regions include first, second, third, and fourth regions.

In addition, a first layer of material is formed over the first region, a second layer of material is formed over the second region, a third layer of material is formed over the third region, and a fourth layer of material is formed over the fourth region.

The first layer of material has a thickness which is approximately equal to a first predetermined electromagnetic wavelength divided by a value equal to two times n where n is an integer. The thickness of the first layer of material prevents light, which is defined by the first predetermined electromagnetic wavelength, from penetrating into the first region.

Similarly, the second and third layers of material have thicknesses which are approximately equal to second and third predetermined electromagnetic wavelengths, respectively, divided by a value equal to two times n where n is an integer. The thicknesses of the second and third layers of material prevent light, which is defined by the second and third predetermined electromagnetic wavelengths, from penetrating into the second and third regions, respectively.

On the other hand, the fourth layer of material has a thickness which allows light, such as the first, second, and third predetermined electromagnetic wavelengths, to penetrate into the fourth region.

In operation, the amount of light defined by the first predetermined electromagnetic wavelength that is contained within the light received by the cell is determined by subtracting the light energy collected by the first photodiode from the light energy collected by the fourth photodiode.

Similarly, the amounts of light defined by the second and third predetermined electromagnetic wavelengths that are contained within the light received by the cell are determined by subtracting the light energy collected by the second and third photodiodes, respectively, from the amount of light energy collected by the fourth photodiode.

A better understanding of the features and advantages of the present invention will be obtained by reference to the following detailed description and accompanying drawings which set forth an illustrative embodiment in which the principals of the invention are utilized.

DETAILED DESCRIPTION

Figure 3:
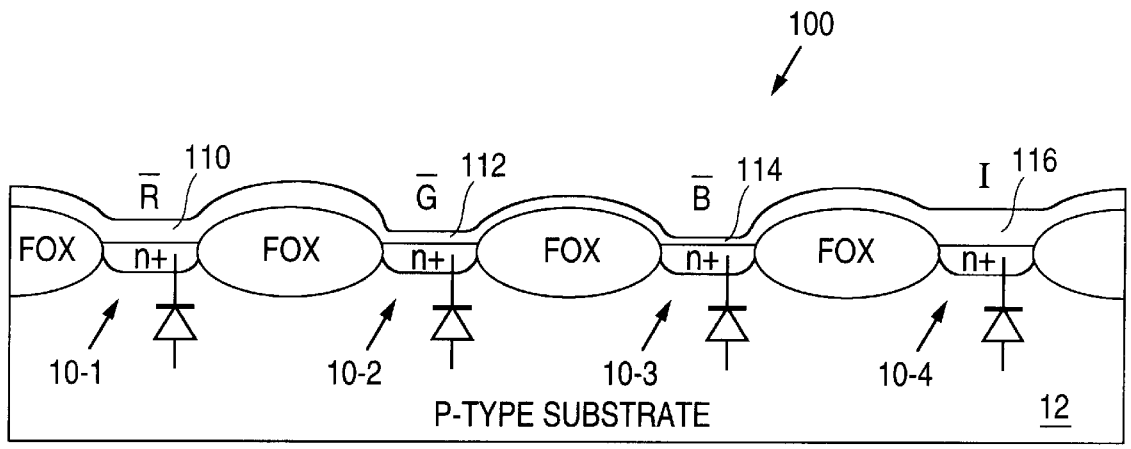
FIG. 3 is a cross-sectional diagram illustrating a portion of a color active pixel sensor cell 100 in accordance with the present invention.

FIG. 3 shows a cross-sectional diagram that illustrates a portion of a color active pixel sensor cell 100 in accordance with the present invention. As described in greater detail below, the present invention reduces the number of to-be-passed photons which are attenuated by conventional dyed resin filters by utilizing layers of oxide with varying thicknesses.

Figure 1:
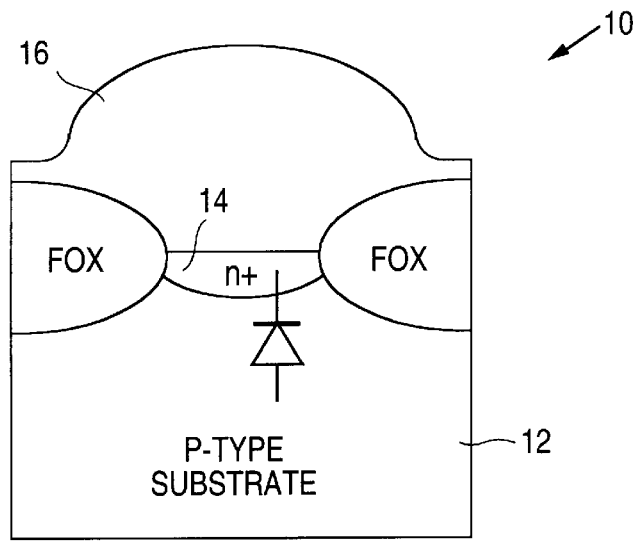
FIG. 1 is a cross-sectional diagram illustrating a conventional photodiode 10.
Figure 2:
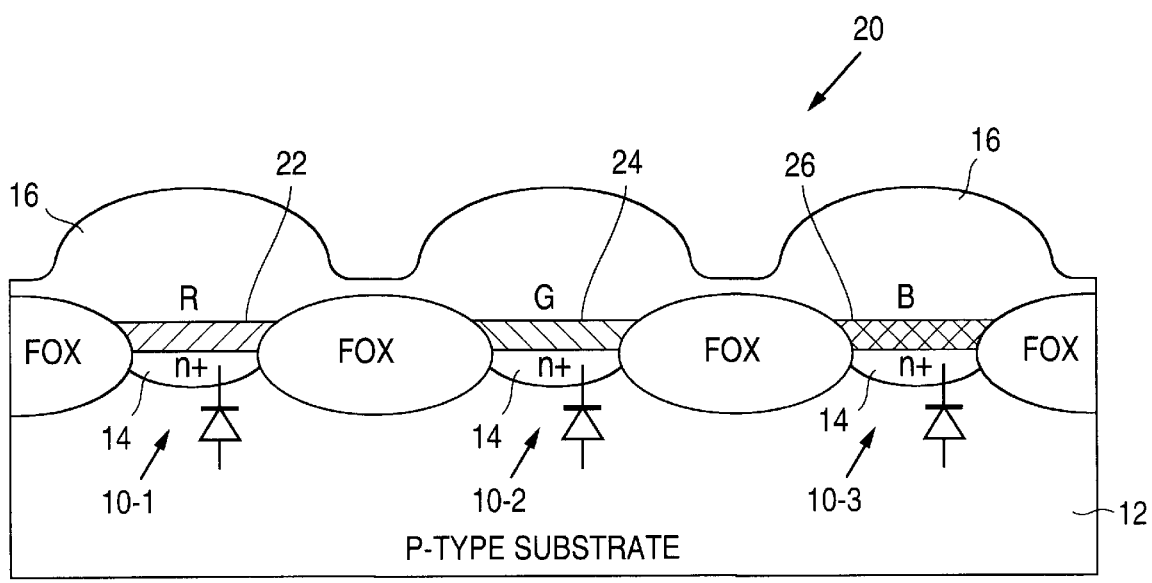
FIG. 2 is a cross-sectional diagram illustrating a portion of a conventional color active pixel sensor cell 20.

As shown in FIG. 3, cell 100 is structurally similar to pixel 20 of FIG. 2 and, as a result, utilizes the same reference numerals to designate the structures which are common to both cells.

Cell 100 principally differs from cell 20 in that cell 100 utilizes a fourth photodiode 10-4, and provides color filtration for three of the four photodiodes 10 by utilizing layers of oxide rather than layers of dyed polyimide resin.

Specifically, cell 100 includes a layer of first oxide 110 which is formed over the surface of n+ region 14 of photodiode 10-1, a layer of second oxide 112 which is formed over the surface of n+ region 14 of photodiode 10-2, a layer of third oxide 114 which is formed over the surface of n+ region 14 of photodiode 10-3, and a layer of fourth oxide 116 which is formed over the surface of n+ region 14 of photodiode 10-4.

In accordance with the present invention, first oxide layer 110 is formed to have a thickness which reflects red light, second oxide layer 112 is formed to have a thickness which reflects green light, third oxide layer 114 has a thickness which reflects blue light, and fourth oxide layer has a thickness that passes visible light.

Figure 4:
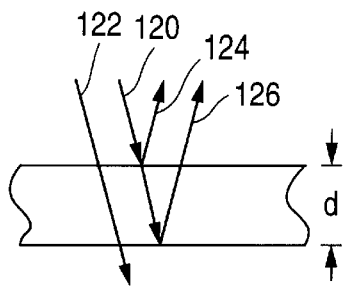
FIG. 4 is a cross-sectional diagram illustrating the operation of first oxide layer 110 in accordance with the present invention.

FIG. 4 shows a cross-sectional diagram that illustrates the operation of first oxide layer 110 in accordance with the present invention. As shown in FIG. 4, the incident visible light striking layer 110 includes red light 120 and non-red light 122. The thickness of layer 110, however, is set so that the red light 120 reflects off of both the top and bottom surfaces of oxide layer 110 as surface reflected red light 124 and bottom reflected red light 126 which is in phase with the surface reflected red light 124. Thus, the total reflected red light is the sum of reflected red lights 124 and 126.

Reflection occurs for any electromagnetic radiation when the wavelength of the radiation is a multiple fraction of 2× the thickness d of the oxide, i.e., 2d, d, 2d/3, d/2. As shown in FIG. 4, bottom reflected wave 126 travels a longer distance than surface reflected wave 124 by 2L which, in turn, is equal to $2d/\cos \theta$.

Assuming, for simplicity, that $\theta$ equals zero, then $\cos \theta$ equals one which yields 2L=2d. If 2L is then set to be equal to $\lambda \cdot n$, where $\lambda$ represents the wavelength and n represents an integer, so that reflected waves 124 and 126 are in phase, then substituting yields $d=\lambda \cdot n/2$. Thus, when the wavelength $\lambda$ of red light equals 2d/n, i.e., 2d for n=1, d for n=2, 2d/3 for n=3, d/2 for n=4, the red light will be reflected away.

In the preferred embodiment, n is set to one as the reflection becomes increasingly weaker with larger values of n. For very thick values of d, almost all of the visible light will pass through the oxide layer as the thicker oxides primarily reflect light with long wavelengths.

Thus, photodiode 10-1 collects all of the visible light photons except for the red photons, photodiode 10-2 collects all of the visible light photons except for the green photons, and photodiode 10-3 collects all of the visible light photons except for the blue photons.

Figure 5:
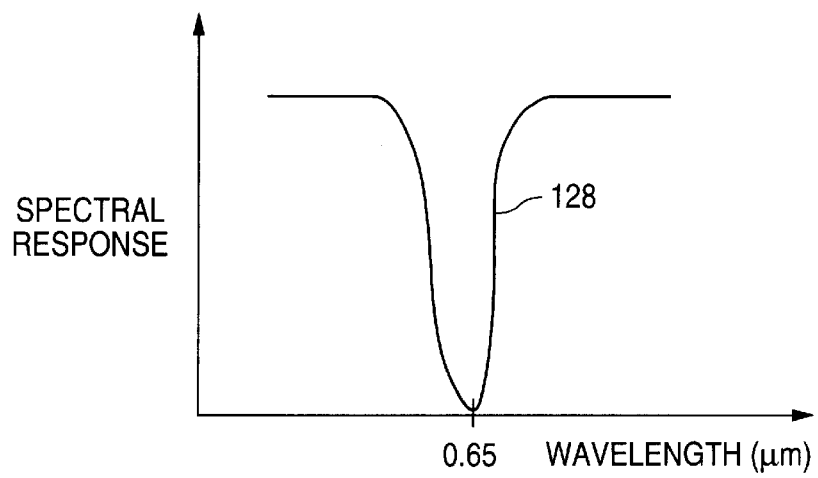
FIG. 5 is a graph illustrating the exclusion of red light from the spectral response of the light passing through oxide layer 110 in accordance with the present invention.

FIG. 5 shows a graph that illustrates the exclusion of red light, which has an electromagnetic wavelength of approximately 0.65 microns, from the spectral response of the light passing through oxide layer 110 in accordance with the present invention. As shown in FIG. 5, a complementary red response 128 is produced when light passes through oxide layer 110 due to the absence of red light.

Similarly, the thicknesses of the second and third oxide layers 112 and 114 are set so that oxide layers 112 and 114 will pass visible light except for green and blue light, respectively. As noted above, the thickness of fourth oxide layer 116 is set so that layer 116 will pass visible light.

In operation, since photodiode 10-4 collects all of the visible light photons, and photodiode 10-1 collects all of the visible light photons except for the red photons, the number of red photons collected by cell 100 is determined by subtracting the number of photons collected by photodiode 10-1 from the number of photons collected by photodiode 10-4.

Similarly, the number of green photons collected by cell 100 is determined by subtracting the number of photons collected by photodiode 10-2 from the number of photons collected by photodiode 10-4, while the number of blue photons collected by cell 100 is determined by subtracting the number of photons collected by photodiode 10-3 from the number of photons collected by photodiode 10-4.

Figure 6:
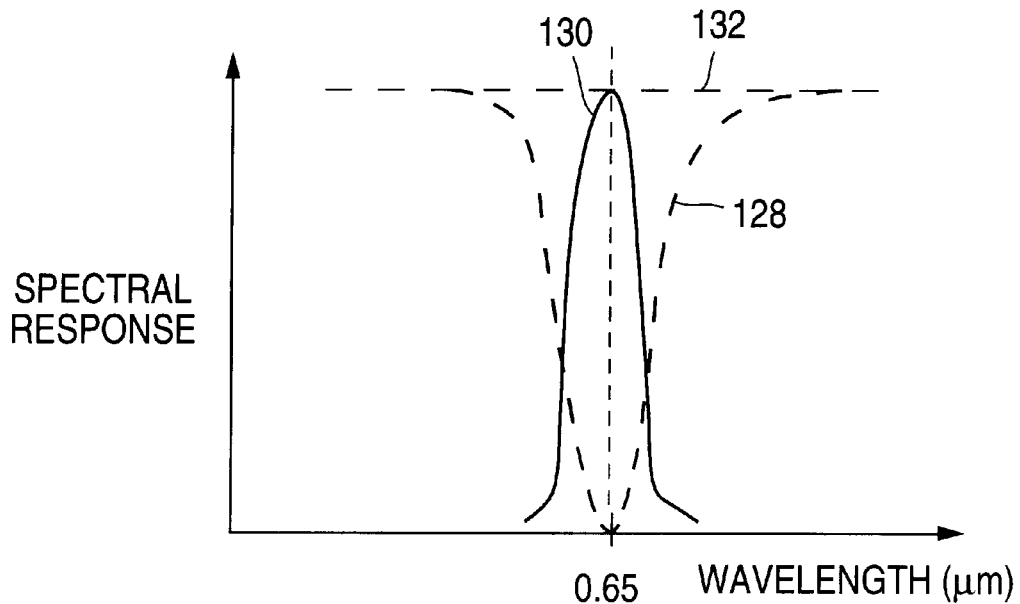
FIG. 6 is a graph illustrating the recovery of the red response in accordance with the present invention.

FIG. 6 shows a graph that illustrates the recovery of the red response in accordance with the present invention. As shown in FIG. 6, a recovered red response 130 is obtained by subtracting the complementary (no red) response 128 obtained from photodiode 10-1 from the reference response 132 obtained from photodiode 10-4. The substraction operation can be performed with analog or digital values by devices which are local to each cell or by devices which are common to each column of cells in an array of cells.

Figure 7:
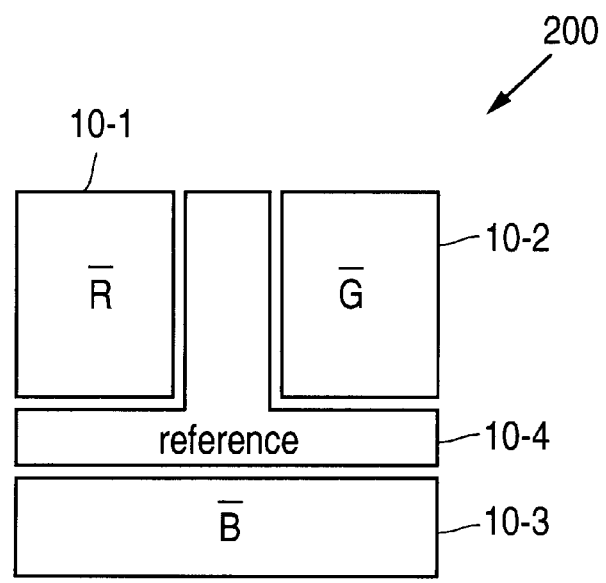
FIG. 7 is a plan view illustrating a layout 200 of cell 100 in accordance with the present invention.

FIG. 7 shows a plan view that illustrates a layout 200 of cell 100 in accordance with the present invention. As shown in FIG. 7, reference photodiode 10-4 is formed between each of the remaining photodiodes 10-1, 10-2, and 10-3. In addition, the area of each pixel 10-1, 10-2, 10-3, and 10-4 can be varied depending on the actual quantum efficiency of the photodiodes.

With respect to the fabrication of cell 100, a number of CMOS processes can be used to precisely control the thickness of the oxide layers 110, 112, 114, and 116. For example, a layer of oxide can be first deposited (LPCVD or PECVD) to the thickness required by photodiode 10-4, and then sequentially wet or dry etched down to the thicknesses required for photodiodes 10-1, 10-2, and 10-3 using three masking steps.

As another example, etch rate inhibitors, such as P31 and B11, can be implanted into a layer of CVD oxide using three masking steps so that a subsequent wet etch will produce oxide layers with different thicknesses. Further, oxidation rate enhancers, such as As, can be implanted into a deposited material, such as polysilicon, so that when the material is oxidized, the resulting oxide layer will have different thicknesses.

Thus, a color active pixel sensor cell has been described that utilizes oxide with varying thicknesses to provide color filtration in lieu the layers of dyed polyimide resin that are conventionally used. The layers of oxide substantially reduce the photon attenuation that is associated with dyed polyimide resin, and are more compatible with standard CMOS fabrication processes than is the organic polyimide resins. In addition, the spectral response of cell 100 can be easily tailored and optimized by adjusting the size and layout of the color photodiodes 10-1, 10-2, and 10-3 and the reference photodiode 10-4.

It should be understood that various alternatives to the embodiment of the invention described herein may be employed in practicing the invention. For example, the oxide filters of the present invention can also be used to measure the number of near infra-red photons that are received by cell 100. Thus, it is intended that the following claims define the scope of the invention and that methods and structures within the scope of these claims and their equivalents be covered thereby.

What is claimed is:

1. A pixel formed in a semiconductor substrate of a first conductivity type, the pixel comprising:

a plurality of spaced-apart regions of a second conductivity type formed in the substrate, the plurality of regions including a first region, a second region, a third region, and a fourth region;

a first layer of material formed over the first region, the first layer of material having a thickness, the thickness of the layer of material reflecting a first predetermined electromagnetic wavelength away from the first region; and a second layer of material formed over the second region, the second layer of material having a thickness which allows the first predetermined electromagnetic wavelength to penetrate into the second region, a third layer of material formed over the third region, the third layer of material having a thickness, the thickness of the third layer of material reflecting a second predetermined electromagnetic wavelength away from penetrating into the third region; and a fourth layer of material formed over the fourth region, the fourth layer of material having a thickness, the thickness of the fourth layer of material reflecting a third predetermined electromagnetic wavelength away from penetrating into the fourth region.

2. The pixel of claim 1 wherein the first predetermined electromagnetic wavelength is a wavelength of red light.

3. The pixel of claim 2 wherein the thickness of the first layer of material is approximately equal to the first predetermined electromagnetic wavelength times n divided by two where n is an integer.

4. The pixel of claim 3 wherein the thickness of the third layer of material is approximately equal to the second predetermined electromagnetic wavelength times n divided by two; and wherein the thickness of the fourth layer of material is approximately equal to the third predetermined electromagnetic wavelength times n divided by two.

5. The pixel of claim 1 wherein the first and second layers of material comprise oxide.

6. The pixel of claim 1 wherein the second region is formed between the first and third regions, the first and fourth regions, and the third and fourth regions.

7. The pixel of claim 6 and further comprising a microlens formed over the layer of material.

8. A pixel formed in a semiconductor substrate of a first conductivity type, the pixel comprising:

a plurality of spaced-apart photodiodes formed in the substrate, the plurality of photodiodes including a first photodiode, a second photodiode, a third photodiode, and a fourth photodiode;

a layer of material formed over the first photodiode, the second photodiodes, the third photodiode, and the fourth photodiode;

the layer of material formed over the first photodiode having a thickness which reflects a first predetermined electromagnetic wavelength, the layer of material formed over the second photodiode having a thickness which passes the first predetermined electromagnetic wavelength, and reflects a second predetermined electromagnetic wavelength, the layer of material formed over the third photodiode having a thickness which passes the first and second predetermined electromagnetic wavelengths, and reflects a third predetermined electromagnetic wavelength, the layer of material formed over the fourth photodiode having a thickness which passes the first, second, and third predetermined electromagnetic wavelengths.

9. The pixel of claim 8 wherein the layer of material includes an oxide.

10. The pixel of claim 8 wherein the fourth photodiode is formed between the first and second photodiodes, between the first and third photodiodes, and between the second and third photodiodes.

11. The pixel of claim 8 wherein the thickness of the layer of material formed over the first photodiode is approximately equal to the first predetermined electromagnetic wavelength times n divided by two where n is an integer.

12. The pixel of claim 11 wherein the thickness of the layer of material formed over the second photodiode is approximately equal to the second predetermined electromagnetic wavelength times n divided by two.

13. The pixel of claim 12 wherein the thickness of the layer of material formed over the third photodiode is approximately equal to the third predetermined electromagnetic wavelength times n divided by two.

14. The pixel of claim 8 and further comprising a microlens formed over the layer of material.

\* \* \* \* \*